United States Patent [19]
So

[11] Patent Number: 5,861,740
[45] Date of Patent: Jan. 19, 1999

[54] LOAD LOSS STANDARD FOR CALIBRATING POWER LOSS MEASUREMENT SYSTEMS

[75] Inventor: Eddy So, Gloucester, Canada

[73] Assignee: National Research Council of Canada, Ottawa, Canada

[21] Appl. No.: 621,934

[22] Filed: Mar. 26, 1996

[51] Int. Cl.$^6$ .................................................. G01R 21/06
[52] U.S. Cl. .......................................................... 324/74
[58] Field of Search .............................. 324/74, 142, 601, 324/546, 537, 141, 140 K; 364/571.01; 330/196, 197, 15.1; 702/106, 126

[56] References Cited

U.S. PATENT DOCUMENTS

| | | | |
|---|---|---|---|
| 3,390,327 | 6/1968 | Bosworth et al. | 324/74 |
| 4,795,969 | 1/1989 | So | 324/74 |
| 5,357,210 | 10/1994 | Miltanic et al. | 330/196 |
| 5,453,697 | 9/1995 | Schweer et al. | 324/601 |

OTHER PUBLICATIONS

"An Improved Current–Comparator–Based 1000–A Transconductance Amplifier for the In–Situ Calibration of Transformer Loss Measuring Systems", P.N. Miljanic et al., IEEE Trans. Power Delivery, vol. 8, pp. 861–865, Jul. 1993.
"The Application of the Current Comparator in Instrumentation for High Voltage Power Measurements at Very Low Power Factors", Eddy So, IEEE Transactions on Power Deliver, vol. PWR D–1, pp. 98–104, Jan. 1986.

Primary Examiner—Vinh P. Nguyen

[57] ABSTRACT

In a load loss standard for calibrating a power measurement system, a pair of reference voltage signals are generated, one in-phase and the other in quadrature with a test voltage ac source. A transconducting and summing amplifier generates an output current corresponding to the vector sum of these reference signals. By varying the magnitude of each of the reference signals independently of each other it becomes possible to vary the phase of the output current relative to the source, while keeping the magnitude of such current constant.

8 Claims, 2 Drawing Sheets

LOAD LOSS STANDARD FOR CALIBRATING POWER LOSS MEASUREMENT SYSTEMS

FIELD OF THE INVENTION

This invention relates to the calibration of power measurement systems, especially high-voltage ones, and, more particularly, to the provision of calibration support to the electrical power industry for obtaining traceability in high-voltage power loss measurements.

BACKGROUND OF THE INVENTION

Accurate loss measurements of power system apparatus, such as large power transformers, high voltage reactors, power capacitor banks, insulator bushings, and power cables are difficult due to the low per factor conditions during testing. Of all these measurements, the most critical is the measurement of losses of large power transformers. There is a penalty, which can be as high as \$10,000/kW for no-load and \$5,000/kW for load loses, for every kilowatt of loss exceeding the guaranteed value. The economic impact of uncertainties associated with the measurement of high-voltage power losses is very high. Therefore traceability and the acceptable accuracy limits of high-voltage power measurements are becoming increasingly more important and critical to manufacturers and utilities. It is important that high-voltage power measuring systems be calibrated after installation and recalibrated on a regular basis to maintain their quoted accuracy and to ensure traceability to higher echelon standards. Manufacturers are now being required to provide documentation certifying the accuracy of their high-voltage power measuring systems through a calibration process that is traceable to such standards.

The manner in which a calibration circuit is used as a load loss standard is explained in a paper by P. N. Miljanic et al. entitled "An Improved Current-Comparator-Based 1000-A Transconductance Amplifier for the In-Situ Calibration of Transformer Loss Measuring Systems" published in IEEE Trans. Power Delivery, vol. 8, pp. 861–865, July 1993. In particular this paper shows in FIG. 1 how a load loss standard is connected to a load loss measuring system under test.

U.S. Pat. No. 4,795,969 to Eddy So issued Jan. 3, 1989 discloses the use of an improved current-comparator technique for obtaining a load loss standard for in-situ calibration of a load loss measuring system. More specifically, this patent provides an active voltage divider and unity-gain integrator for generating reference voltage signals $E_0$ and $E_{90}$ that are respectively in-phase and in quadrature with a test voltage source $E_H$. The signal $E_0$ is applied to an adjustable voltage divider. The reference signals $E_0$ and $E_{90}$ are applied through reference resistors to a current comparator in the forms of in-phase and quadrature reference current signals $I_0$ and $I_{90}$ proportional to $E_0$ and $E_{90}$ respectively. The signals $E_0$ and $E_{90}$ are also supplied to an amplifier assembly (including a summing amplifier and a transconductance amplifier), that generates a standard load current $I_L$ that is supplied to the current comparator through the loss measuring system under test. As more fully explained in the So patent, the primary function of the current comparator is to correct for errors.

The phase of the standard load current $I_L$ can be adjusted by the voltage divider which varies the magnitude of the in-phase voltage $E_0$ relative to a fixed magnitude for the quadrature voltage $E_{90}$. This phase adjustability is required in order to test the loss measuring system at different power factors. However, the effect of varying the voltage $E_0$, while the voltage $E_{90}$ remains unchanged, is to vary the value of their summation voltage, and hence the value of the load current $I_L$. As a result, adjustment of the voltage divider not only varies the phase of the output current $I_L$ but also its magnitude, which is an undesirable side effect.

Another disadvantage of the prior system is that there is no provision for changing the level of the output current without changing the test voltage.

SUMMARY OF THE INVENTION

It is thus an object of the present invention to provide an improved arrangement that enables the phase of the load current (relative to the test voltage) to be varied at will while maintaining its magnitude at a predetermined value.

It is a further object to provide for changing the output current $I_L$ at the same test voltage.

It is a further object of an embodiment of the invention to provide a system that automatically adjusts the parameters as the load current phase is varied, in order to keep its magnitude constant, and in order to enable its magnitude to be selected without change to the test voltage.

It is a still further object of an embodiment of the invention to provide such a system in which the phase of the load current can be varied through the full range from zero power factor lagging to zero power factor leading in both directions, i.e. through 360°.

More specifically, the invention relates to a load loss standard for calibrating a power measuring system, comprising (a) means for connection to a test voltage ac source for generating a pair of reference voltage signals respectively in-phase and in quadrature with respect to said source, and (b) transconductance and summing amplifier means for generating an output current corresponding to the vector sum of said reference signals. The invention comprises means for varying the magnitude of each of said reference voltage signals independently of one another whereby to control the magnitude of the output current and its phase relative to the source independently of each other.

Figure 1:
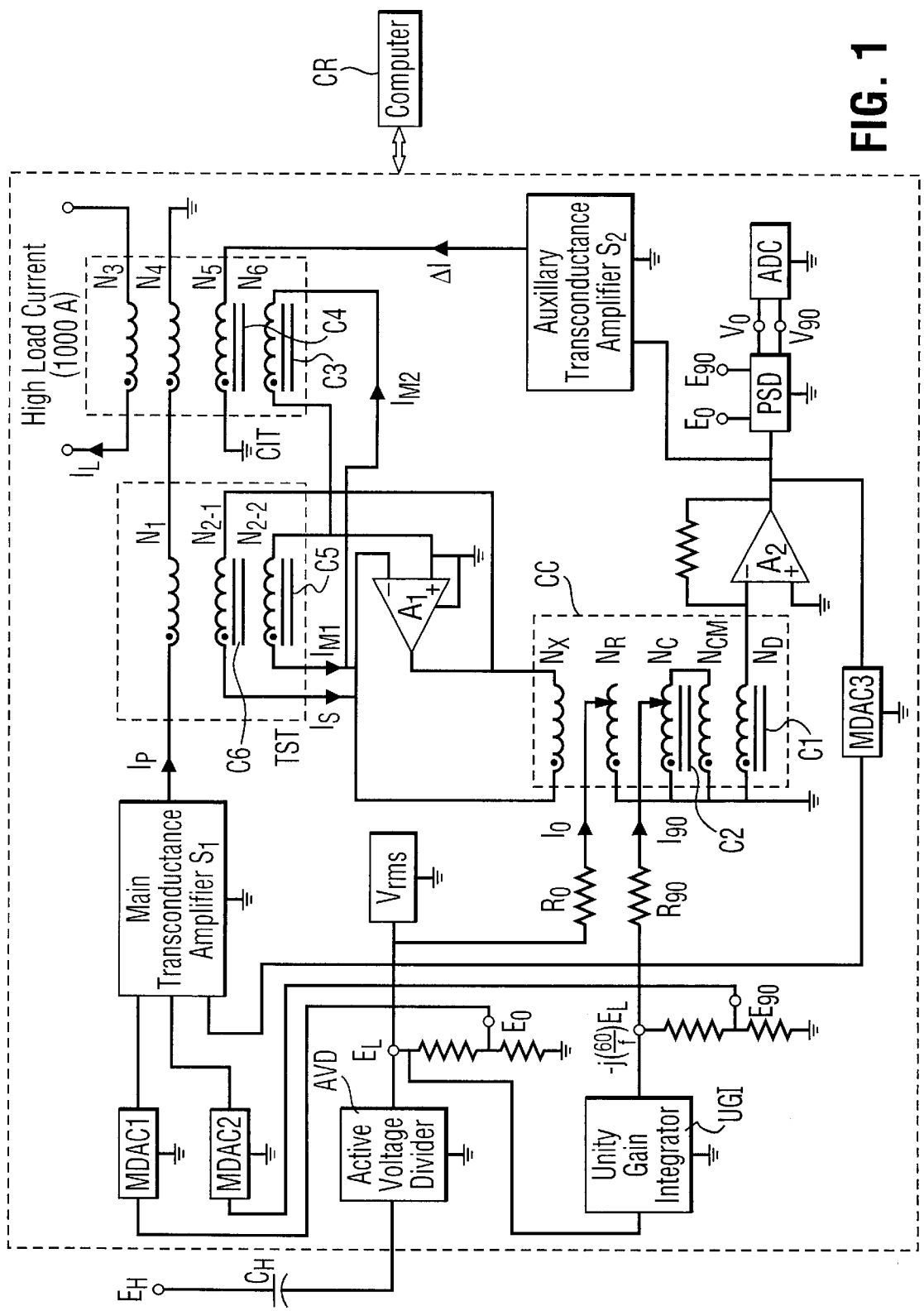
FIG. 1 is a circuit showing a preferred embodiment of the invention.
Figure 2:
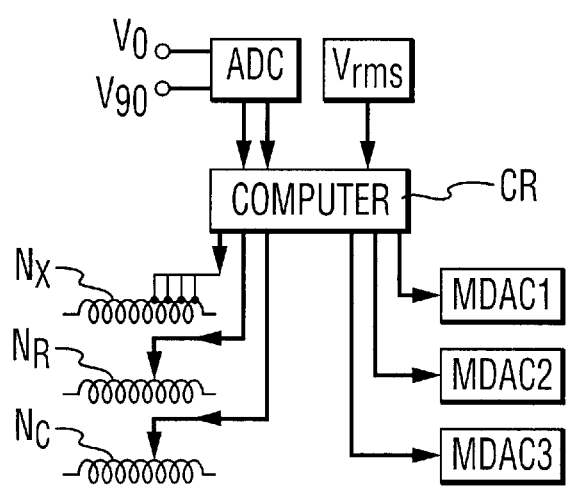
FIG. 2 is a diagram indicating the manner in which a computer is connected to such circuit.

The broken lines in FIG. 1 connected to a computer CR indicate that this computer controls the circuit. The specific manner in which this control is exercised is illustrated in FIG. 2.

DETAILED DESCRIPTION OF THE PREFERRED EMBODIMENT

FIG. 1 shows a current comparator CC comprising a first ratio winding $N_X$, the number of turns of which can be selected by a stepping control (not shown); a variable, second ratio winding $N_R$, a third ratio winding $N_C$; a compensation winding $N_{CM}$; a detection winding $N_D$; and two cores $C_1$ and $C_2$. The core $C_1$ is located inside all the windings, and the core $C_2$ is located inside the windings $N_C$, $N_R$ and $N_X$, but outside the windings $N_{CM}$ and $N_D$. This orientation of cores and windings is known.

The adjustable-turn (six-digit resolution) windings $N_R$ and $N_C$ may have a nominal 100 turns. The compensation winding $N_{CM}$ can also have 100 turns and can be connected in parallel to either winding $N_R$ or $N_C$ to reduce their leakage impedances (shown in the drawing connected in parallel to winding $N_C$). The in-phase and quadrature reference currents $I_0$ and $I_{90}$ driving the $N_R$ and $N_C$ windings are derived through 12-kilohm reference resistors $R_0$ and $R_{90}$, respectively. Switching (not shown) can be provided for reversing the polarity of the ratio windings, including the compensation winding. The 500-turn detection winding $N_D$ is connected to a current-to-voltage converter $A_2$ to obtain a voltage proportional to, and in-phase with, the unbalanced ampere-turns in the current comparator.

A current injecting transformer CIT comprises a primary winding $N_4$; a secondary winding $N_3$; a correction winding $N_5$; a detection winding $N_6$; and two cores $C_3$ and $C_4$. The core $C_3$ is located inside all the windings, and the core $C_4$ is located inside the windings $N_3$, $N_4$ and $N_5$, but outside the winding $N_6$. This form of current injecting transformer is also known. The current injecting transformer CIT can conveniently have a 50-turn primary winding $N_4$, a one-turn correction winding $N_5$, and a 1000-turn detection winding $N_6$. With a one-turn secondary winding $N_3$, it is capable of providing a load current $I_L$ of up to 1000 A with an equivalent compliance voltage of 3 V.

A two-stage current transformer TST comprises a primary winding $N_1$; a first stage secondary winding $N_{2-1}$; a second stage secondary winding $N_{2-2}$; and two cores $C_5$ and $C_6$. The core $C_5$ is located inside all the windings, and the core $C_6$ is located inside the windings $N_1$ and $N_{2-1}$, but outside the winding $N_{2-2}$. This ratio extending two-stage current transformer TST, is in cascade with the $N_X$ winding, and can have a 50-turn primary winding $N_1$ and 1000-turn first and second-stage secondary windings $N_{2-1}$ and $N_{2-2}$. To minimize the loading effect on the second-stage secondary winding, the $N_X$ winding is placed in the feedback of an amplifier $A_1$.

Also provided are main and auxiliary transconductance amplifiers $S_1$ and $S_2$ having a rated output current of 20 A and 10 A, respectively. As before, the amplifier $S_1$ includes a summing amplifier that generates the vector sum of the voltages applied to it. A detailed discussion of the transconductance amplifiers, the current injecting transformer CIT, the current comparator CC, and the two-stage current transformer TST can be found in the Miljanic et al. paper. referred to above.

The test voltage $E_H$ is applied through a high-voltage reference capacitor $C_H$ to an active voltage divider AVD coupled to a unity gain integrator UGI. Multiplying digital-to-analog converters MDAC1 and MDAC2 which are devices that receive an analog input voltage, emit an analog output voltage, and are controlled by a digital input signal from the computer (see FIG. 2) are connected between these elements and the main transconductance amplifier $S_1$ and serve to control the amplitudes of the in-phase and quadrature voltages $E_0$ and $E_{90}$ supplied to and summed in such amplifier, and hence the magnitude and phase of its output current $I_P$ In FIG. 1, the terminal above the capacitor $C_H$ that receives the test voltage source $E_H$, the capacitor $C_H$ itself, the active voltage divider AVD, the unity gain integrator UGI, and the voltage dividing resistors shown below the terminals labelled with voltages $E_L$ and $-j(60/f)E_L$, produce the in-phase and quadrature voltages $E_0$ and $E_{90}$ and hence together constitute means for connection to a test voltage ac source for generating a pair of reference voltage signals respectively in-phase and in quadrature with respect to said source.

Also in FIG. 1, the main transconductance amplifier $S_1$, which receives these reference voltage signals $E_0$ and $E_{90}$, generates their vector sum and transforms this sum into an output current $I_P$, constitutes transconductance and summing amplifier means for generating an output current corresponding to the vector sum of said reference signals.

Further, the converters MDAC1 and MDAC2, by virtue of their connection in the inputs of the amplifier $S_1$, comprise means for varying the magnitude of each of said reference voltage signals independently of one another.

A combined feedback technique and a error feed-forward method is used for control of the load current $I_L$.

The current comparator CC is used to measure indirectly the error of the load current $I_L$, due to the combined errors of the main transconductance amplifier $S_1$ and the magnetizing error of the current injecting transformer CIT. This is achieved by comparing the sum of the output current $I_P$ of the main transconductance amplifier $S_1$ (reduced by the ratio extending two-stage current transformer TST) together with the magnetizing current $I_{M2}$ of the current injecting transformer, to the in-phase ($I_0$) and quadrature ($I_{90}$) reference currents derived from the test voltage $E_H$ through the active voltage divider AVD, the unity-gain integrator UGI and their associated reference resistors $R_0$ and $R_{90}$, respectively. The unbalanced ampere-turns in the current comparator CC are therefore a measure of the combined errors, and hence the current comparator CC constitutes means for monitoring the magnitude of said output current, namely the current $I_P$. A voltage proportional to this unbalance, derived through the detection winding $N_D$ and the amplifier $A_2$ is then used to drive the auxiliary transconductance amplifier $S_2$ to provide an error-feed-forward current $\Delta I$ to the correction winding $N_5$ of the current injecting transformer CIT, resulting in a highly accurate and stable load current $I_L$. The error feed-forward signal can be made as small as possible by adjusting the magnitude and phase of the output current $I_P$ of the main transconductance amplifier $S_1$ for minimum output of the amplifier $A_2$, using the multiplying digital-to-analog converters MDAC1 and MDAC2, respectively.

Nonlinearities in the main transconductance amplifier $S_1$ could cause distortion in the waveform of its output current $I_P$. This, in turn, could cause a high harmonic content in the unbalanced ampere-turns signal. These harmonics could saturate the amplifier $A_2$ and/or the auxiliary transconductance amplifier $S_2$, causing a large error in the error feed-forward signal $\Delta I$, thereby compromising the overall accuracy of the load current $I_L$. To minimize this problem, and also the effects of large drifts in the main transconductance amplifier, a feedback circuit from the output of amplifier $A_2$ to the input of the main transconductance amplifier $S_1$ is incorporated. The loop gain is adjustable using a third multiplying digital-to-analog converter MDAC3. Since only minimal loop gain in this feedback circuit is required, less than 10, instability causing oscillations is not a problem.

The active and reactive power components measured by the system under test are given by $$E_H I^*_L = (N_6/N_3)(i/N_X)((mE^2_L/R_O)N_R + j(60/f)(mE^2_L R_{90})N_C)$$

where m is the ratio of the active voltage divider AVD and f is the test frequency. The in-phase and quadrature components of the load current $I_L$, and hence the test conditions, are set by the number of turns of the windings $N_R$, $N_C$, and $N_X$. The winding turns on the current comparator CC are preset for the desired magnitude of load current and power factor, and this effect can be achieved without changing the test voltage $E_H$. MDAC1 and MDAC2 controlling the two voltage components driving the main transconductance amplifier $S_1$, are set to bring about a minimum ampere-turn unbalance condition, as indicated by the outputs $V_0$ and $V_{90}$ of a phase sensitive detector PSD that also receives the reference voltages $E_0$ and $E_{90}$. The outputs $V_0$ (in-phase) and $V_{90}$ (quadrature) are monitored by an analog-to-digital converter ADC that has two sections, one for in-phase and one for quadrature.

The active voltage divider AVD and the unity-gain integrator UGI providing the in-phase and quadrature reference currents are current-comparator-based instruments, and are further described in a paper by Eddy So entitled "The Application of the Current Comparator in Instrumentation for High Voltage Power Measurements at Very Low Power Factors" published in IEEE Trans. Power Delivery, vol. PWR D-1, pp. 98–104, January 1986. The active voltage divider can conveniently have an equivalent feedback capacitor of 200 nF, an output range of 120 V, and seven computer-controlled gain settings of 1, 2, 5 10, 20, 50, and 100. These gain settings provide an equivalent ratio $m=E_H/E_L=200/(C_H \cdot \text{gain setting})$, where $C_H$ is the capacitance of the high-voltage reference capacitor in nanofarads. Therefore, with a 100-pF 200-kV reference capacitor $C_H$, the divider ratio m can be set by the computer at 2,000, 1,000, 400, 200, 100, 40, and 20. This in turn allows the load loss standard to be operated at the corresponding voltage ranges of 200 kV, 100 kV, 40 kV, 20 kV, 10 kV, 4 kV, and 2 kV. The output of the unity-gain integrator is $-j(60/f)E_L$.

Before a calibration is undertaken, the load loss standard must be standardized by measuring the deviations from nominal of the high-voltage reference capacitor $C_H$ and the reference resistors $R_0$ and $R_{90}$. The magnitudes of these deviations are taken into account by offsetting the $N_R$ and $N_C$ winding turns. The test conditions, such as the test voltage, the load current, and the power factor are entered as data into the computer CR. The $N_R$ and $N_C$ winding turns, the ratio multiplier ($N_X$ winding), the gain setting of the active voltage divider AVD, and the multiplying digital-to-analog converters MDAC1 and MDAC2, are then automatically controlled by the computer to reflect the desired magnitude of the load current and power factor at the test voltage.

The computer CR receives the two outputs (in-phase and quadrature) of the converter ADC and hence the digital equivalent of the two analog outputs $V_0$ and $V_{90}$ of the phase sensitive detector. It also receives the output $E_L$ of the active voltage divider AVD via a digital ac voltmeter $V_{rms}$. The computer then controls the number of active turns in use in each of the windings $N_X$, $N_R$ and $N_C$, as well as the multiplying ratio of each of the converters MDAC1, MDAC2 and MDAC3. These variable conditions are adjusted by the computer to bring the outputs $V_0$ and $V_{90}$ to zero. Due to this arrangement, the output current $I_P$ remains constant in magnitude regardless of the power factor that has been chosen.

Hence the computer, together with the converter ADC from which it receives the outputs $V_0$ and $V_{90}$ (which outputs are in turn controlled by the output of the current comparator CC, i.e. the monitoring means), constitute means responsive to said monitoring means for controlling the means for varying the magnitudes of the reference signals to maintain the magnitude of the output current at a predetermined value independent of the phase of said output current, since the computer controls the converters MDAC1 and MDAC2 (FIG. 2 and above) to bring the output current $I_P$ to the desired ("predetermined") value independent of the power factor chosen, i.e. independent of the phase of the output current relative to the test voltage. Also this magnitude can be set at different levels without changing the test voltage. Moreover, the power factor range is from zero (lagging) through unity to zero (leading), positive or negative power, i.e. throughout the entire 360° of phase condition.

The calibration is performed by instructing the computer to take a series of samples from the output of the active voltage divider AVD, through the voltmeter $V_{rms}$, for a period of a few seconds which is determined by the operator. The samples are then processed to yield the test voltage $E_H$, the load current $I_L$, and the reference power loss to the system under test at a particular power factor. The procedure may be repeated automatically for a preset number of times after which the overall average of the test voltage, the load current, and the reference power are calculated.

The load loss standard, due to the high compliance voltage of the transconductance amplifier $S_1$ (about 3 V at 1000 A), is capable of calibrating simultaneously all three phases of a system under test. This is achieved by having the three voltage transformers and the three current transformers of the system under test connected in parallel and in series, respectively. The three voltage transformers and the load loss standard are then simultaneously driven by one phase of the test voltage source. The current injecting transformer CIT of the load loss standard in turn drives the three current transformers. The measurement results of all three phases of the system under test are then compared to the reference power loss at a particular test voltage, load current, and power factor.

While the foregoing example of the invention has been directed towards a standard design for use in calibrating a system for measuring the short circuit loss (the copper loss) of a large power transformer, since this is a major requirement of industry, the invention is also applicable to the calibration of a system for measuring losses in other power system apparatus, such as reactors, capacitors, insulators and cables.

I claim:

1. In a load loss standard for calibrating a power measuring system, comprising (a) means for connection to a test voltage ac source for generating a pair of reference voltage signals respectively in-phase and in quadrature with respect to said source, and (b) transconductance and summing amplifier means for generating an output to current corresponding to the vector sum of said reference signals, (c) the improvement comprising means for varying the magnitude of each of said reference voltage signals independently of one another whereby to control the magnitude of said output current and its phase relative to the source independently of each other.

2. The load loss standard of claim 1, including (d) means for monitoring the magnitude of said output current, and (e) means responsive to said monitoring means for controlling the means for varying the magnitudes of the reference signals to maintain the magnitude of the output current at a predetermined value independent of the phase of said output current.

3. The load loss standard of claim 2, wherein said monitoring means also monitors the phase of said output current.

4. The load loss standard of claim 3, wherein said monitoring means includes a current comparator having a first winding connected to receive a current proportional in magnitude and corresponding in phase to said output current, a second winding connected to receive a current proportional in magnitude and corresponding in phase to the in-phase reference signal, a third winding connected to receive a current proportional in magnitude and corresponding in phase to the quadrature reference signal, and a detection winding for detecting an ampere-turn unbalance in said comparator.

5. The load loss standard of claim 4, wherein said means for controlling the means for varying the magnitudes of the reference signals also controls the number of turns on each of said first, second and third windings, whereby to enable the magnitude of the output current to be selected without changing the test voltage.

6. The load loss standard of claim 5, wherein said controlling means is connected to receive a signal from the means monitoring the magnitude and phase of the output current.

7. The load loss standard of claim 6, wherein said controlling means is also connected to receive a voltage in phase with the source and proportion in magnitude to the in-phase reference signal.

8. The load loss standard of claim 1, including means for generating a load current proportional in magnitude and identical in phase to the output current.

* * * * *